(12) United States Patent
Niu et al.

(10) Patent No.: US 12,490,603 B2
(45) Date of Patent: Dec. 2, 2025

(54) DISPLAY PANEL AND DISPLAY DEVICE (71) Applicant: Wuhan China Star Optoelectronics Semiconductor Display Technology Co., Ltd., Hubei (CN)

(72) Inventors: Yanfen Niu, Hubei (CN); Xiaoxia Zhang, Hubei (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 0 days.

(21) Appl. No.: 17/780,549

(22) PCT Filed: May 23, 2022

(86) PCT No.: PCT/CN2022/094376
§ 371 (c)(1),
(2) Date: May 27, 2022

(87) PCT Pub. No.: WO2023/206671
PCT Pub. Date: Nov. 2, 2023

(65) Prior Publication Data
US 2024/0179966 A1    May 30, 2024

(30) Foreign Application Priority Data
Apr. 26, 2022   (CN) .......................... 202210450811.6

(51) Int. Cl.
*H10K 59/131*    (2023.01)
*H10K 59/124*    (2023.01)

(52) U.S. Cl.
CPC ......... *H10K 59/131* (2023.02); *H10K 59/124* (2023.02)

(58) Field of Classification Search
CPC ..... H10K 59/131; H10K 59/123; H10K 59/12
See application file for complete search history.

(56) References Cited

U.S. PATENT DOCUMENTS 11,968,865 B2    4/2024    Huang et al.
12,029,088 B2    7/2024    Qing et al.
(Continued)

FOREIGN PATENT DOCUMENTS

| CN | 110459586 | 11/2019 |
|---|---|---|
| CN | 111106154 | 5/2020 |

(Continued)

OTHER PUBLICATIONS

Notification of Office Action and Search Report Dated Aug. 1, 2024 From The State Intellectual Property Office of the People's Republic of China Re. Application No. 202210450811.6 and Its Translation Into English. (16 Pages).

(Continued)

*Primary Examiner* — Michele Fan
(74) *Attorney, Agent, or Firm* — PV IP PC; Wei Te Chung (57) ABSTRACT

A display panel and a display device are disclosed. The display panel includes at least a part of plurality of first connection parts arranged at intervals along a first direction. Each pixel electrode is connected to one driving transistor through the first connection part. The first connection parts are further configured to connect signal lines. An area of each of the first connection parts disposed sequentially increases along the first direction, or the area of each of the first connection parts is the same. The area is an orthographic projection area of the first connection part on a base substrate.

16 Claims, 6 Drawing Sheets

(56) References Cited

U.S. PATENT DOCUMENTS

| | | |
|---|---|---|
| 2014/0284579 A1 | 9/2014 | Tokuda et al. |
| 2015/0055038 A1 | 2/2015 | Nagami |
| 2022/0140018 A1* | 5/2022 | Liu ................... H10K 59/353 257/40 |
| 2022/0199959 A1* | 6/2022 | Yu ..................... H10K 59/87 |
| 2024/0040857 A1 | 2/2024 | Peng |

FOREIGN PATENT DOCUMENTS

| | | | | |
|---|---|---|---|---|
| CN | 111584757 A | | 8/2020 | |
| CN | 112071268 | | 12/2020 | |
| CN | 213025136 | | 4/2021 | |
| CN | 112786640 A | * | 5/2021 | ........... H01L 27/156 |
| CN | 113629113 | | 5/2021 | |
| CN | 113097263 | | 7/2021 | |
| CN | 113725233 | | 11/2021 | |
| CN | 113871427 | | 12/2021 | |
| CN | 114005840 | | 2/2022 | |
| CN | 114078384 | | 2/2022 | |
| CN | 215834552 U | | 2/2022 | |
| CN | 114141829 | | 3/2022 | |
| WO | WO 2021/147082 | | 7/2021 | |

OTHER PUBLICATIONS

International Search Report and the Written Opinion Dated Dec. 29, 2023 From the International Searching Authority Re. Application No. PCT/CN2022/094376 and Its Translation Into English. (18 Pages).

Chinese Office Action issued in corresponding Chinese Patent Application No. 202210450811.6 dated Jan. 24, 2025, pp. 1-6.

* cited by examiner

DISPLAY PANEL AND DISPLAY DEVICE

RELATED APPLICATIONS

This application is a National Phase of PCT Patent Application No. PCT/CN2022/094376 having International filing date of May 23, 2022, which claims the benefit of priority of China Patent Application No. 202210450811.6 filed on Apr. 26, 2022. The contents of the above applications are all incorporated by reference as if fully set forth herein in their entirety.

FIELD AND BACKGROUND OF THE INVENTION

The present application relates to the technical field of display devices, and more particularly, to a display panel and a display device.

AMOLED display technology is an emerging panel technology. It has advantages of low power consumption, low cost, wide color gamut, high resolution, and high color saturation, etc., as well as characteristics of being bendable, easy to change shape and portable. It is recognized by the industry as the display technology with the most development potential.

In the display panel, it is usually necessary to set signal lines for providing signals to sub-pixels. The signal line is connected to a driving switch through a connection line. However, for a high-resolution AMOLED display device, when the same power supply voltage is used to supply power to each pixel unit in a display area, due to an irregular wiring of connection lines, corresponding pixel units have different luminous brightness, which in turn leads to uneven display of areas with brightness differences (mura) in the display panel, which affects a display performance of the display panel.

SUMMARY OF THE INVENTION

The present application provides a display panel and a display device to solve an issue of uneven display of the display panel.

In one aspect, the present application provides a display panel comprising:
a base substrate;
a plurality of sub-pixels disposed on the base substrate in an array, wherein each of the sub-pixels comprises a pixel circuit and a light-emitting element, the pixel circuit is configured to drive the light-emitting element, the pixel circuit comprises driving transistors, and the light-emitting element comprises a pixel electrode;
a plurality of first connection parts, wherein each of the first connection parts is connected to one of pixel electrodes and one of the driving transistors, the first connection parts are further configured to connect signal lines, the first connection parts extend along a first direction, adjacent first connection parts are disposed at intervals, and a middle part of one of the first connection parts is provided with a first bending part.
a plurality of first connection parts, wherein at least a part of the first connection parts are arranged at intervals along a first direction, each of the pixel electrodes is connected to one of the driving transistors through the first connection parts, the first connection parts are further configured to connect signal lines, an area of each of the first connection parts sequentially increases arranged along the first direction or the area of each of the first connection parts is same, and the area of each of the first connection parts is an orthographic projection area of each of the first connection parts on the base substrate.

In the display panel of the present application, when the area of each of the first connection parts arranged along the first direction increases sequentially, a width of each of the first connection parts is same, and a length of each of the first connection parts sequentially increases along the first direction.

In the display panel of the present application, at least another part of the first connection parts is arranged along a second direction, each of the first connection parts arranged along the second direction has a same orthographic projection area on the base substrate, and the first direction and the second direction intersect.

In the display panel of the present application, the display panel comprises a first display area and a fan-out area, the fan-out area overlaps with the first display area, and the first connection parts are located in the first display area.

In the display panel of the present application, the display panel further comprises a second display area, the first display area and the second display area are arranged adjacent to each other, the first connection parts are further located in the second display area, an area of each of the first connection parts in the first display area is same as an area of each of the first connection parts in the second display area.

In the display panel of the present application, the driving transistor comprises:
an active layer disposed on one side of the base substrate;
a gate layer disposed on the active layer; and
a source and drain layer disposed on the gate layer;
wherein the display panel further comprises a first via hole and a second via hole, each of the first connection parts is connected to the source and drain layer through the first via hole and is connected to the pixel electrode through the second via hole.

In the display panel of the present application, the display panel further comprises:
a plurality of second connection parts, wherein each of the second connection parts is connected between the pixel electrode and one of the first connection parts.

In the display panel of the present application, the first connection parts and the second connection parts are made of a transparent conductive material.

In the display panel of the present application, orthographic projections of the first via hole and the second via hole on the base substrate are arranged adjacent to each other, or the orthographic projections of the first via hole and the second via hole on the base substrate are arranged at intervals.

In the display panel of the present application, the driving transistor further comprises:
a first planarization layer disposed on the source and drain layer, wherein the first connection parts are disposed on the first planarization layer, the first planarization layer is provided with the first via hole, the source and drain layer is exposed through the first via hole, and the first connection parts are electrically connected to the source and drain layer through the first via hole;
a second planarization layer disposed on the first connection parts, wherein the second connection parts are disposed on the second planarization layer, the second planarization layer is provided with a second via hole, the first connection parts are exposed from the second via hole, and the second connection parts are electrically connected to the first connection parts through the second via hole.

In the display panel of the present application, the driving transistor further comprises:
a third planarization layer disposed on the second connection parts, wherein the pixel electrode is disposed on the third planarization layer, the third planarization layer is provided with a third via hole, the second connection parts are exposed through the third via hole, and the pixel electrode is electrically connected to the second connection parts through the third via hole.

In the display panel of the present application, the driving transistor further comprises:
a bridge layer disposed between the source and drain layer and the first connection parts, one end of the bridge layer is connected to the first connection parts, and another end of the bridge layer is connected to a source or a drain of the source and drain layer.

In the display panel of the present application, a material of the bridge layer is same as a material of the source and drain layer.

On the other hand, the present application further provides a display device, which includes a display panel, and the display panel includes:
a base substrate;
a plurality of sub-pixels disposed on the base substrate in an array, wherein each of the sub-pixels comprises a pixel circuit and a light-emitting element, the pixel circuit is configured to drive the light-emitting element, the pixel circuit comprises driving transistors, and the light-emitting element comprises a pixel electrode;
a plurality of first connection parts, wherein at least a part of the first connection parts are arranged at intervals along a first direction, each of the pixel electrodes is connected to one of the driving transistors through the first connection parts, the first connection parts are further configured to connect signal lines, an area of each of the first connection parts sequentially increases arranged along the first direction or the area of each of the first connection parts is same, and the area of each of the first connection parts is an orthographic projection area of each of the first connection parts on the base substrate.

In the display device of the present application, when the area of each of the first connection parts arranged along the first direction increases sequentially, a width of each of the first connection parts is same, and a length of each of the first connection parts sequentially increases along the first direction.

In the display device of the present application, at least another part of the first connection parts is arranged along a second direction, each of the first connection parts arranged along the second direction has a same orthographic projection area on the base substrate, and the first direction and the second direction intersect.

In the display device of the present application, the display panel comprises a first display area and a fan-out area, the fan-out area overlaps with the first display area, and the first connection parts are located in the first display area.

In the display device of the present application, the display panel further comprises a second display area, the first display area and the second display area are arranged adjacent to each other, the first connection parts are further located in the second display area, an area of each of the first connection parts in the first display area is same as an area of each of the first connection parts in the second display area.

In the display device of the present application, the display panel further comprises:
a plurality of second connection parts, wherein each of the second connection parts is connected between the pixel electrode and one of the first connection parts, and the first connection parts and the second connection parts are made of a transparent conductive material.

In the display device of the present application, each of the first connection parts further comprises a first via hole and a second via hole, each of the first connection parts is connected to the source and drain layer through the first via hole and is connected to the pixel electrode through the second via hole.

The present application provides a display panel and a display device. The first connection part of the display panel is used to connect the driving transistor and the pixel electrode, and also used to connect signal lines. By setting the first connection part along the first direction Y, the orthographic projection area on the base substrate is sequentially increased, excessive difference in brightness of regions corresponding to different first connection parts can be avoided. Therefore, in the first direction Y of the display panel, the luminous brightness of the sub-pixels corresponding to the first connection part is in a gradient form. In this way, a boundary of display brightness is weakened in the first direction Y, thereby improving a brightness uniformity of the display panel. Or by setting the orthographic projection area of each first connection part on the base substrate to be the same, a regularity of a distribution of the first connection part is improved. This makes a light emission of the sub-pixels corresponding to the first connection parts regular, thereby improving an overall brightness uniformity of the display panel. The embodiments of the present application improve a regularity of an arrangement of the first connection parts on the display panel, so that when the pixel circuit drives the sub-pixels to emit light, a uniformity of display of the sub-pixels can be improved, thereby improving an overall display performance of the display panel.

BRIEF DESCRIPTION OF THE SEVERAL VIEWS OF THE DRAWINGS

The technical solutions and other beneficial effects of the present application will be apparent through the detailed description of the specific embodiments of the present application in conjunction with the accompanying drawings.

DESCRIPTION OF SPECIFIC EMBODIMENTS OF THE INVENTION

The technical solutions in the embodiments of the present application will be clearly and completely described below with reference to the accompanying drawings in the embodiments of the present application. Obviously, the described embodiments are only a part of the embodiments of the present application, but not all of the embodiments. Based on the embodiments in the present application, all other embodiments obtained by those skilled in the art without creative work fall within the protection scope of the present application.

In addition, in the description of the present application, "plurality" means two or more, unless otherwise expressly and specifically defined. In this application, unless otherwise expressly specified and limited, a first feature "on" or "under" a second feature may include the first and second features in direct contact or may include the first and second features not directly but through additional features between them. Also, the first feature being "above", "over" and "on" the second feature includes the first feature being directly above and obliquely above the second feature, or simply means that the first feature is level higher than the second feature. The first feature is "below", "under" and "underneath" the second feature includes the first feature is directly below and diagonally below the second feature, or simply means that the first feature has a lower level than the second feature. In the description of the present application, "plurality" means two or more, unless otherwise expressly and specifically defined.

The following disclosure provides many different embodiments or examples for implementing different structures of the present application. To simplify the disclosure of the present application, the components and arrangements of specific examples are described below. Of course, they are only examples and are not intended to limit the application. Furthermore, this application may repeat reference numerals and/or reference letters in different instances. This repetition is for the purpose of simplicity and clarity and does not in itself indicate a relationship between the various embodiments and/or arrangements discussed.

Embodiments of the present application provide a display panel and a display device, which will be described in detail below.

Referring to FIG. 1 to FIG. 8, an embodiment of the present application provides a display panel. The display panel is provided with a plurality of sub-pixels 20, and at least one of the sub-pixels 20 includes a pixel circuit (not shown) and a light-emitting element 30.

The pixel circuit is used to drive the connected light-emitting element 30. For example, the pixel circuit is configured to supply a drive current to drive the light emitting element 30 to emit light. The pixel circuit may include a plurality of thin film transistors and at least one capacitor. For example, the pixel circuit may have a 3T1C (3 TFTs and 1 capacitor) structure, a 7T1C (7 TFTs and 1 capacitor) structure, or a 5T1C (5 TFTs and 1 capacitor) structure, and so on. Corresponding scanning signals, light-emitting driving signals, data signals, etc. can be received through the pixel circuit, so as to drive the light-emitting element 30 to emit light. The specific principle of the pixel circuit driving the light-emitting element 30 to emit light is not repeated here.

In an embodiment of the present application, the pixel circuit includes a driving transistor 21, and the light-emitting element 30 includes a pixel electrode 31. The pixel electrode 31 may be an anode of the OLED light-emitting device.

Figure 6:
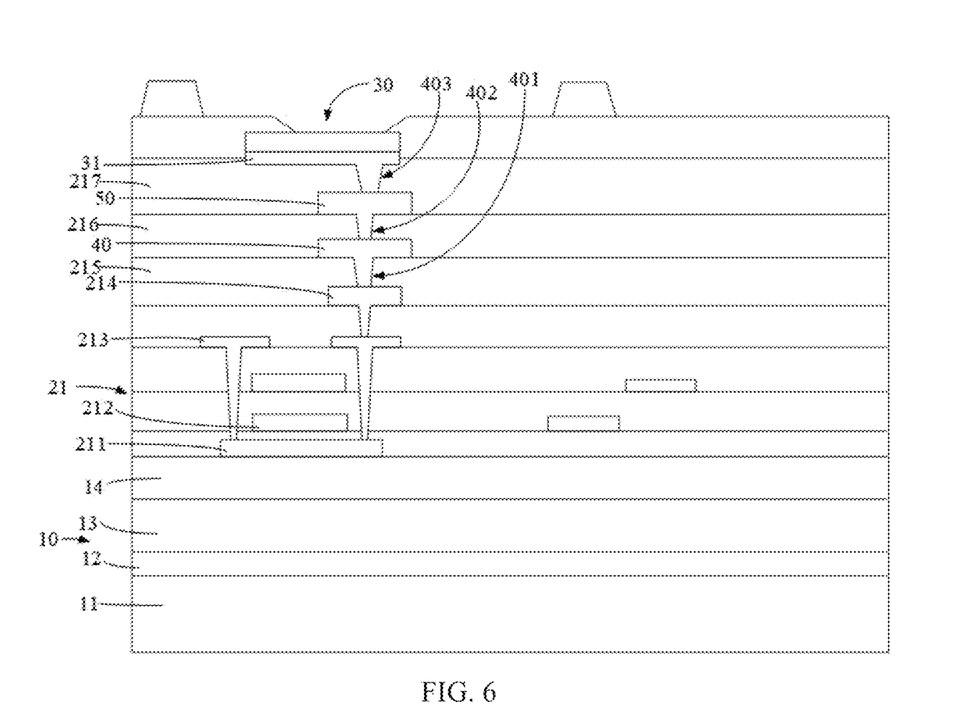
FIG. 6 is a schematic cross-sectional structure diagram of a display panel according to an embodiment of the present application.

A base substrate 10 may be a flexible base substrate 10 or a rigid base substrate 10. Exemplarily, when the base substrate 10 is a flexible base substrate 10, a material of the base substrate 10 may be polyimide (PI), polyethylene naphthalate (PEN), thermoplastic polyester (PET), etc. When the base substrate 10 is a rigid base substrate 10, the base substrate 10 may be a rigid material such as glass and quartz. Taking the base substrate 10 as a PI substrate as an example, the base substrate 10 may adopt a single-layer PI structure, and the base substrate 10 may also adopt a double-layer PI structure. As shown in FIG. 6, the base substrate 10 includes a first PI substrate 11, a first buffer layer 12, a second PI substrate 13, and a second buffer layer 14, which are sequentially arranged from bottom to top along its thickness direction.

A plurality of driving transistors 21 are arrayed on the base substrate 10. A plurality of pixel electrodes 31 are disposed on the driving transistor 21. In this embodiment, the display panel is an OLED display panel as an example. Correspondingly, the light-emitting element 30 may be an organic light-emitting diode (OLED). The light-emitting element 30 emits red light, green light, blue light, or white light, etc. Under the driving of its corresponding pixel circuit, the color of light emitted by the light-emitting element 30 can be determined as required. The pixel electrode 31 in the embodiment of the present application may be an anode of the light-emitting element 30. Specifically, the light-emitting element 30 may include an anode, a cathode, and a light-emitting functional layer between the anode and the cathode. The anode of the light-emitting element 30 may be electrically connected to the driving transistor 21 in the corresponding pixel circuit.

At least a part of the plurality of first connection parts 40 are arranged along a first direction Y at intervals. Each pixel electrode 31 is connected to one driving transistor 21 through the first connection part 40. The first connection part 40 corresponds to a sub-pixel array arrangement. Specifically, the first connection parts 40 can be arranged in multiple rows along the first direction Y and arranged in multiple rows along a second direction X, for example. The first connection parts 40 arranged in a row along the second direction X may be referred to as the first connection parts 40 in the same row. The first connection parts 40 arranged in a row along the first direction Y are referred to as the first connection parts 40 in the same row. The first connection parts 40 in the same column may be electrically connected with one data line. The first direction Y may be a vertical direction parallel to the display plane of the display panel. The second direction X may be a horizontal direction parallel to the display plane of the display panel.

Figure 1:
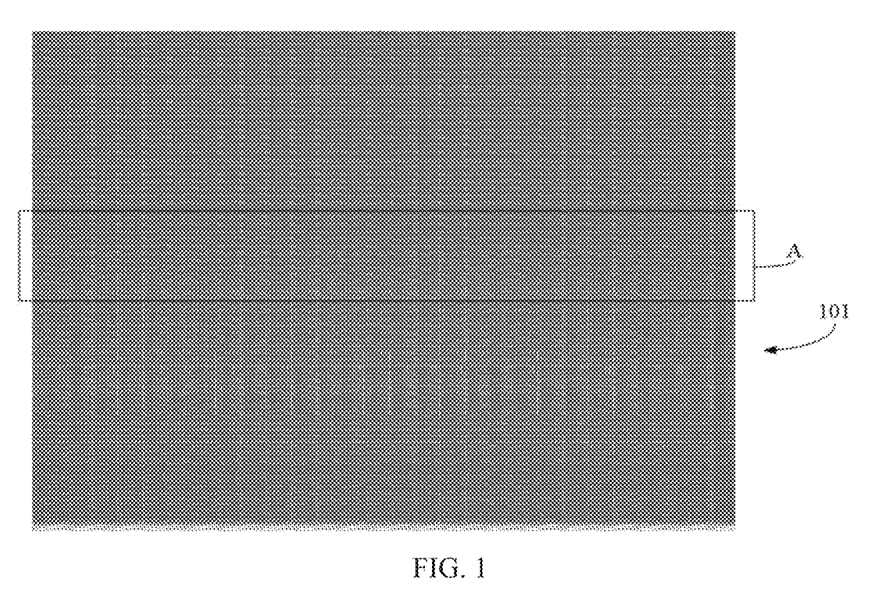
FIG. 1 is a schematic top-view structure diagram of a display panel provided by an embodiment of the present application.
Figure 2:
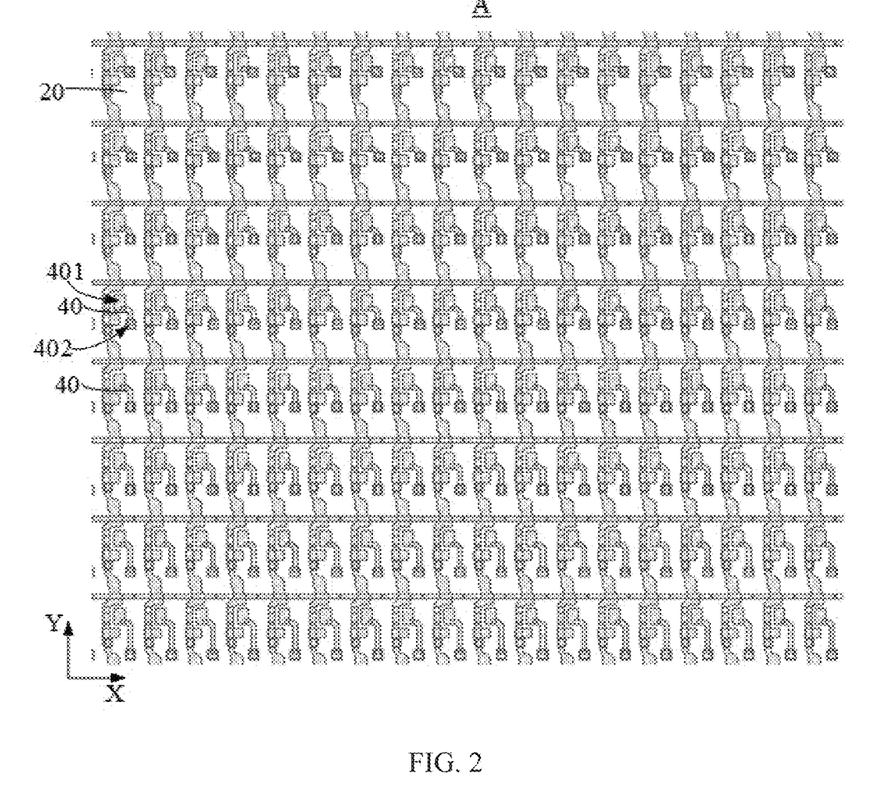
FIG. 2 is a partial enlarged schematic diagram of part A of FIG. 1 in an embodiment of the present application.
Figure 3:
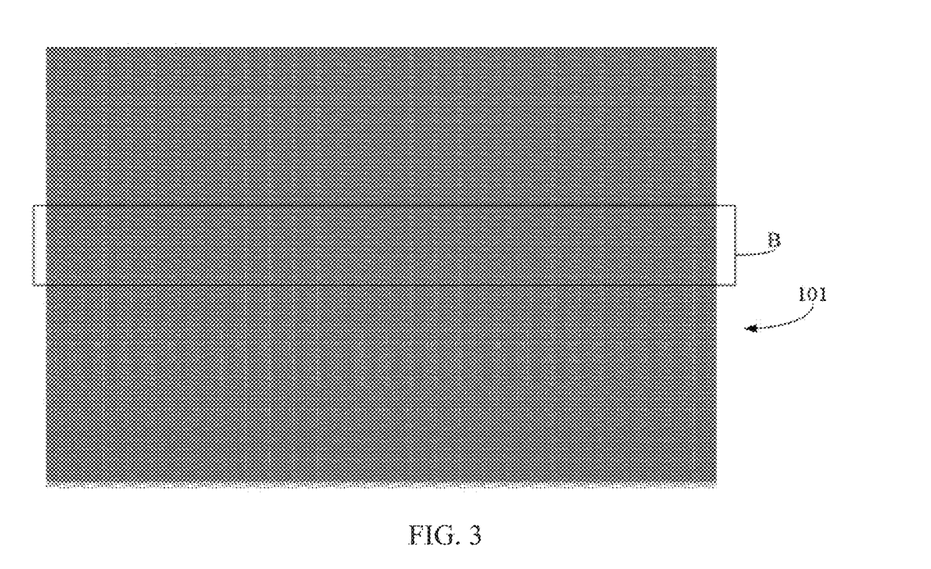
FIG. 3 is a schematic top-view structural diagram of a display panel according to another embodiment of the present application.
Figure 4:
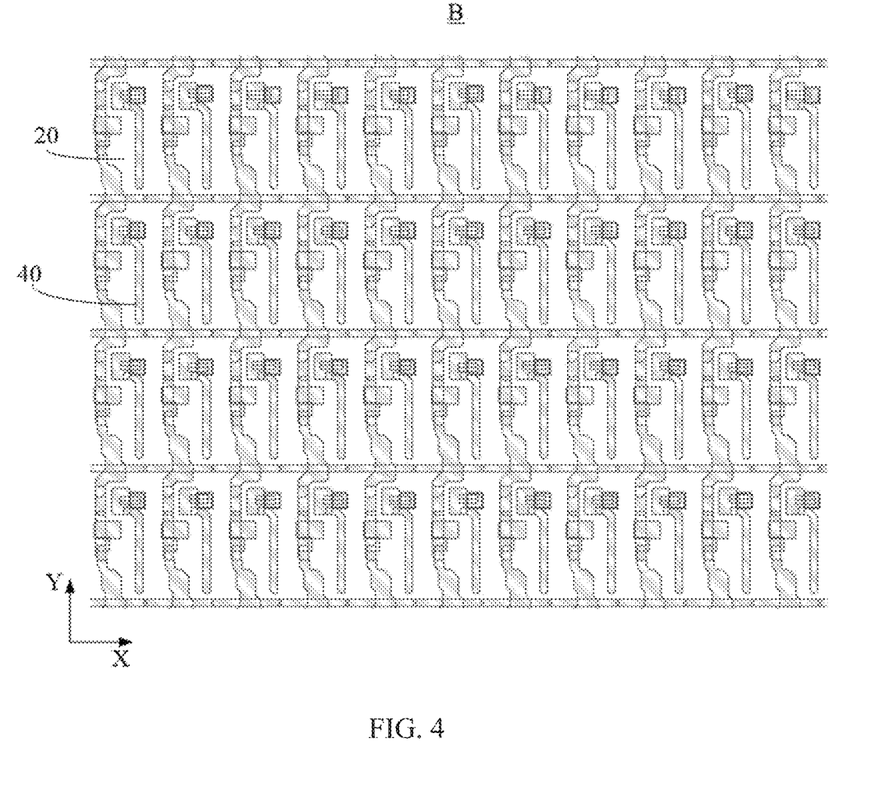
FIG. 4 is an enlarged schematic diagram of part B of FIG. 3 in an embodiment of the present application.

As shown in FIG. 2, the area of each of the first connection parts 40 disposed along the first direction Y increases sequentially. Alternatively, as shown in FIG. 4, the area of each of the first connection parts 40 is the same. Exemplarily, for each first connection part 40 arranged along the first direction Y in the display panel, that is, each first connection part 40 in the same column, the area may be increase sequentially from top to bottom in the first direction Y. Alternatively, the area may also increase sequentially from bottom to top in the first direction Y, that is, the area of the first connection part 40 is gradually arranged in the first direction Y. It is understood that the area of each of the first connection parts 40 disposed along the first direction Y in the display panel may also be the same. The area refers to the orthographic projection area of the first connection part 40 on the base substrate 10. By improving the regularity of the area distribution of the first connection parts 40, it can be prevented that in the setting area of the first connection parts 40, due to the different areas of the first connection parts 40, the continuous reflection of light leads to different first connection parts 40. The brightness of the sub-pixels above is different, which makes the display brightness of a certain place change obviously. That is, by controlling the distribution density of the first connection parts 40, the display area where the first connection parts 40 are located plays a role of transition of display performance, thereby reducing the issue of uneven display caused by the arrangement of the first connection parts 40.

In the embodiment of the present application, the first connection part 40 of the display panel is used for connecting the driving transistor 21 and the pixel electrode 31 and is also used for connecting the signal line. By setting the orthographic projection areas of the first connection parts 40 along the first direction Y on the base substrate 10 to increase in sequence, it is possible to avoid excessive brightness differences between regions corresponding to different first connection parts 40. Therefore, in the first direction Y of the display panel, the light-emitting brightness of the sub-pixels 20 corresponding to the first connection part 40 is in a gradient form. In this way, the boundary of display brightness is weakened in the first direction Y, thereby improving the brightness uniformity of the display panel. Alternatively, by setting the orthographic projection area of each first connection part 40 on the base substrate 10 to be the same, the regularity of the distribution of the first connection part 40 is improved. This makes the light emission brightness of the sub-pixels 20 corresponding to the first connection part 40 regular, thereby improving the brightness uniformity of the entire display panel. The embodiment of the present application improves the regularity of the arrangement of the first connection parts 40 on the display panel. Therefore, when the pixel circuit drives the sub-pixels 20 to emit light, the uniformity of the display of the sub-pixels 20 can be improved, thereby improving the overall display performance of the display panel.

In some embodiments, when the area of each first connection part 40 disposed along the first direction Y increases sequentially, the width of each first connection part 40 is the same, and the length of each first connection part 40 is along the first direction Y increases sequentially. In the embodiment of the present application, the first direction Y may be the vertical direction, that is, the length direction of the first connecting part 40. Correspondingly, the second direction Y may be the horizontal direction, that is, the width direction of the first connection part 40. Due to the space of the display panel, when the first connection part 40 forms the connection line, the line width is controlled within a certain range, the production precision is required to be high, and issues such as short circuits are prone to occur during the production process. For example, the width of the first connection part 40 is in the range of from 0.5 mm to 10 mm. Therefore, on the basis of the same width of the first connection parts 40, the length of each first connection part 40 is set to increase sequentially along the first direction Y. That is, the length of the first connection part 40 is set to change regularly. Therefore, in the setting area of the first connection part 40, due to the different area of the first connection part 40, the continuous reflection of light leads to the different brightness of the sub-pixels above the different first connection parts 40, so that a certain row or a certain place is different. The brightness of the display changes obviously. That is, by controlling the distribution density of the first connection parts 40, the display area where the first connection parts 40 are located plays a role of transition of display performance, thereby reducing the issue of uneven display caused by the arrangement of the first connection parts 40.

In some embodiments, at least another part of the plurality of first connection parts 40 is arranged along the second direction X. The orthographic projection area of each of the first connection parts 40 arranged along the second direction X on the base substrate 10 is the same. The first direction Y and the second direction X intersect. Along the second direction X, adjacent first connection parts 40 are arranged at intervals. The plurality of first connection parts 40 are arranged in an array. The first connection parts 40 are arranged in a row in the second direction X and in a column in the first direction Y. In the embodiment of the present application, by setting the area of the first connection part 40 along the second direction X to be the same, the luminance difference of the sub-pixels 20 in the same row due to the area difference of the first connection part 40 is avoided. This improves the luminance uniformity of the sub-pixels 20 corresponding to the first connection parts 40 in the same row, so that the display uniformity of each sub-pixel 20 in the same row can be improved.

The first direction Y and the second direction X intersect. The first direction Y and the second direction X may be set parallel to the same display plane of the display panel. Specifically, in this embodiment, the first direction Y and the second direction X may be directions perpendicular to each other. When the first direction Y is a vertical direction, the second direction X may be a horizontal direction. In addition, parallel means the state which the angle formed by two straight lines is −10 degrees or more and 10 degrees or less. Therefore, the state where this angle is −5° or more and 5° or less is also included. In addition, "perpendicular" refers to a state in which the angle formed by two straight lines is 80° or more and 1000 or less. Therefore, the state of the angle of 850 or more and 950 or less is also included.

Figure 5:
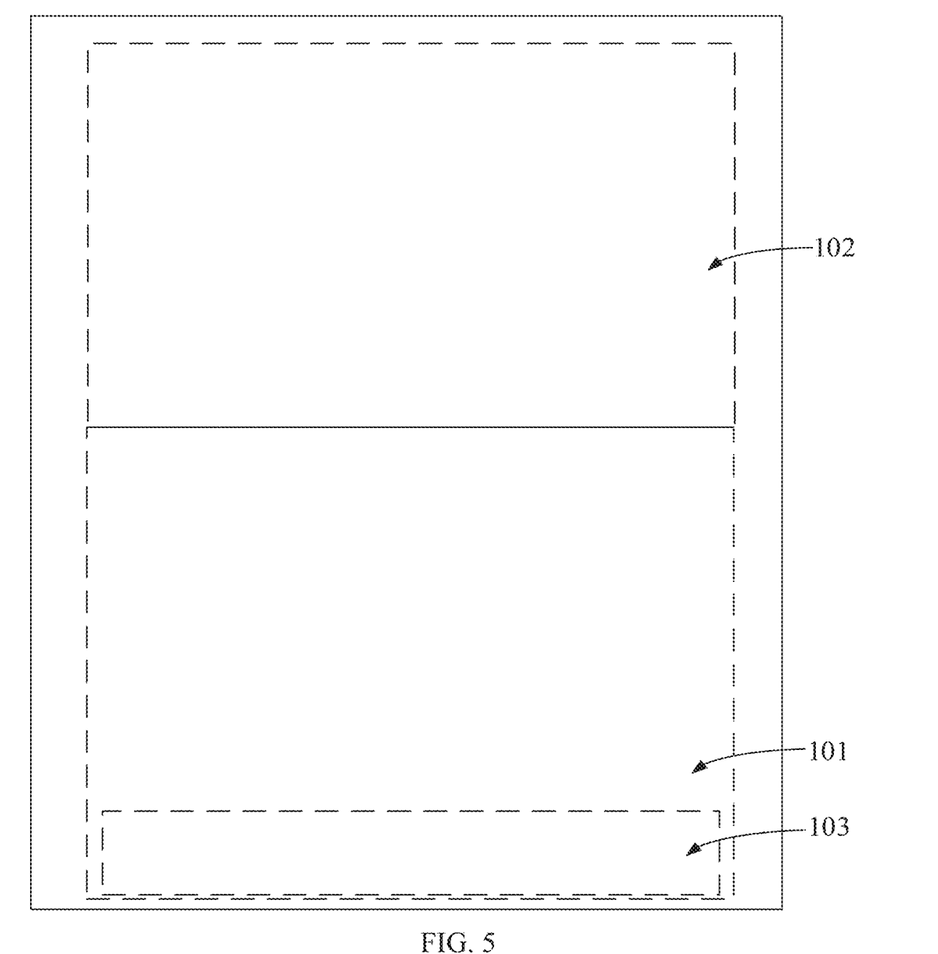
FIG. 5 is a schematic structural diagram of each region of a display panel according to an embodiment of the present application.

In some embodiments, as shown in FIG. 5, the display panel includes a first display area 101 and a fan-out area 103. The fan-out area 103 coincides with the first display area 101. That is, the first display area 101 includes the fan-out area 103. The first connection part 40 is located in the first display area 101. That is, the first connection part 40 is also located in the fan-out area 103.

The first display area 101 is an area in the display panel where an image is actually displayed. The fan-out area 103 refers to an area where a plurality of data lines of the display panel are gathered in a fan shape. One end of the fan-out area 103 is electrically connected to a plurality of data lines of the display panel, and the other end of the fan-out area 103 is electrically connected to the gate driving circuit, so that the gate driving circuit realizes progressive scan driving. Generally, the fan-out area 103 is located in the non-display area of the display panel, which is not conducive to the realization of a narrow frame or no frame of the display panel. When the fan-out area 103 coincides with the first display area 101 (Fanout in AA, FIAA), that is, along the thickness direction of the display panel, the fan-out area 103 is located below the first display area 101, so that the fan-out area 103 can be multiplexed as an area for displaying images. Exemplarily, the fan-out region 103 may be provided in the same layer as the gate driving circuit or may be provided in a different layer with the gate driving circuit, as long as the fan-out area 103 is located below the first display area 101, there is no specific limitation. By setting the fan-out area 103 to overlap with the first display area 101, the non-display area of the display panel can be further reduced or eliminated. This facilitates the realization of a narrow frame or no frame of the display panel. This is also beneficial to improve the uneven horizontal visual display in the off-screen and on-screen states due to the irregular wiring of the first connection part 40 when the fan-out area 103 is displayed.

The shape of the first display area 101 may be various. Exemplarily, the first display area 101 may be a rectangle, such as a rectangle with rounded corners. The first display area 101 may also be circular or oval. It is understood that the first display area 101 may also be in other shapes such as a rectangle, a semicircle, and a pentagon. This embodiment does not specifically limit this.

Figure 7:
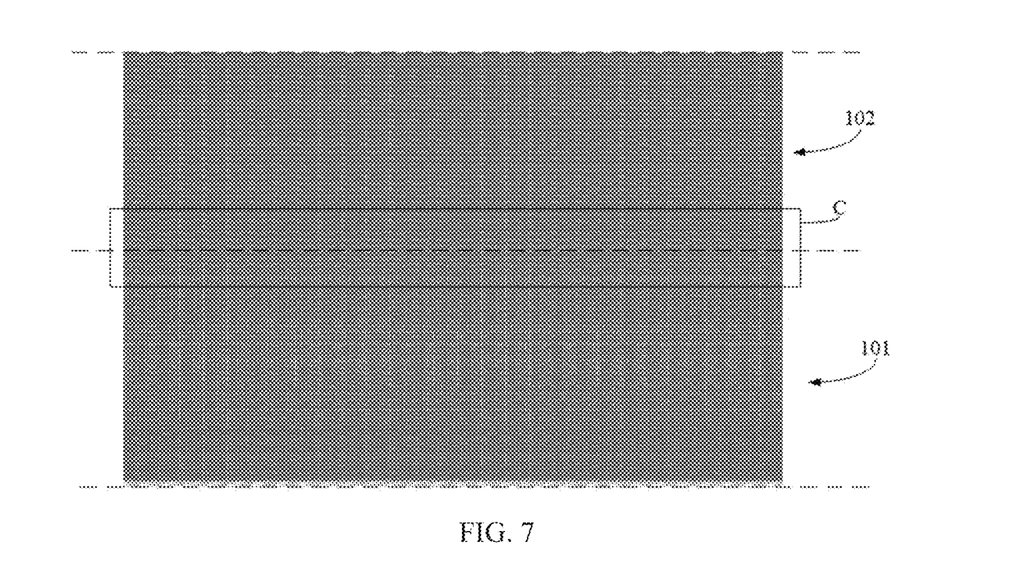
FIG. 7 is a schematic top-view structure diagram of a display panel according to another embodiment of the present application.
Figure 8:
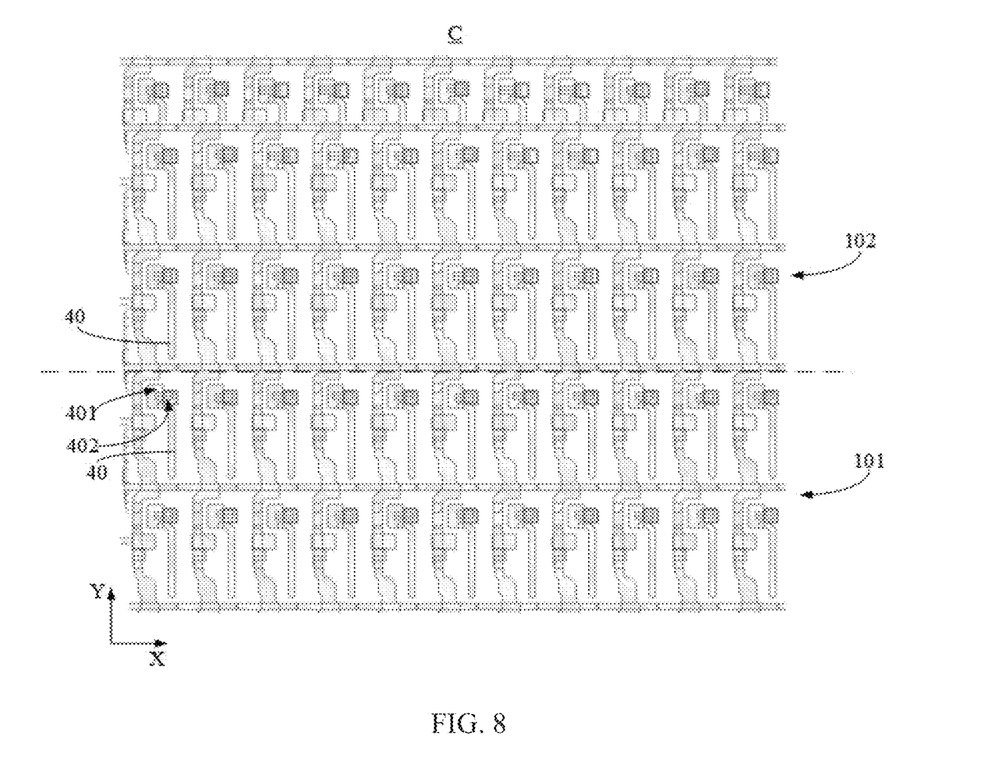
FIG. 8 is an enlarged schematic diagram of part C in FIG. 7 in an embodiment of the present application.

In some embodiments, as shown in FIG. 7 and FIG. 8, the display panel further includes a second display area 102. The first display area 101 and the second display area 102 are arranged adjacent to each other. The first connection part 40 is also located in the second display area 102. The area of each first connection part 40 in the first display area 101 is the same as the area of each first connection part 40 in the second display area 102. Regardless of whether the first connection parts 40 are located in the first display area 101 or the second display area 102, all the first connection parts 40 have the same area. Exemplarily, taking the first connection parts 40 located in the first display area 101 as an example, the length of each first connection part 40 and the width of each first connection part 40 are the same. By setting the area of each of the first connection parts 40 in the first display area 101 and the second display area 102 to be the same, the brightness difference of different first connection parts 40 is reduced. This makes the brightness in the direction in which the second display area 102 of the display panel points to the first display area 101 is the same. This weakens the boundary between the first display area 101 and the second display area 102 and prevents the display performance from exhibiting obvious abrupt changes. In this way, the regularity of the arrangement of the first connection parts 40 in the second display area 102 is further improved. Therefore, when the pixel circuit drives the sub-pixels 20 to emit light, the display uniformity of the sub-pixels 20 in the second display area 102 can be improved. Further, the display uniformity of the first display area 101 and the second display area 102 in the display panel can be improved, which is beneficial to further improve the overall display performance of the display panel.

The second display area 102 is an area in the display panel where an image is actually displayed. Relative to the first display area 101, the second display area 102 is a conventional display area. That is, the second display area 102 does not overlap with the fan-out area 103. Specifically, the first display area 101 may be located at the top middle position of the display panel. The second display area 102 may surround the first display area 101. However, this embodiment does not limit this. Exemplarily, the first display area 101 may be located at other positions such as the upper left corner or the upper right corner of the display panel. Alternatively, the second display area 102 may surround at least one side of the first display area 101. The shape of the second display area 102 may be various, for example, the second display area 102 may be a rectangle, such as a rectangle with rounded corners. The second display area 102 may also be circular or oval. It can be understood that the second display area 102 can also have other shapes such as a rectangle, a semicircle, a pentagon, and the like. This embodiment does not specifically limit this.

In some embodiments, please refer to FIG. 6, the display panel further includes a plurality of second connection parts 50. Each second connection part 50 is connected between one pixel electrode 31 and one first connection part 40. The second connection part 50 may be used to connect a voltage signal line VDD, the data line Data, and the like. In this way, the number of connections between the driving transistor 21 and the driving lines is increased, so that the display driving capability of the display panel can be enhanced.

In some embodiments, the first connection part 40 and the second connection part 50 are made of transparent conductive material. Specifically, both the first connection part 40 and the second connection part 50 may be indium tin oxide (ITO), indium zinc oxide (IZO), indium gallium zinc oxide (IGZO) in any one or several forms. Since the grating effect of the transparent conductive material is small, the first connection part 40 and the second connection part 50 are also made of transparent conductive material. Therefore, the grating effect of the first connection part 40 and the second connection part 50 made of metal can be effectively reduced, which is beneficial to further improve the display performance of the display panel.

In some embodiments, please continue to refer to FIG. 6, the driving transistor 21 includes an active layer 211, a gate layer 212, and a source and drain layer 213. The active layer 211 is disposed on one side of the base substrate 10, the gate layer 212 is disposed on the active layer 211, and the source and drain layer 213 is disposed on the gate layer 212.

In some embodiments, as shown in FIG. 6, the driving transistor 21 further includes a first planarization layer 215, a second planarization layer 216, and a third planarization layer 217.

The first planarization layer 215 is disposed on the source and drain layer 213. The first connection part 40 is disposed on the first planarization layer 215. The first planarization layer 215 is provided with the first via hole 401. The source and drain layer 213 are exposed through the first via hole 401. The first connection part 40 is electrically connected to the source and drain layer 213 through the first via hole 401.

The second planarization layer 216 is disposed on the first connection part 40. The second connection part 50 is disposed on the second planarization layer 216. The second planarization layer 216 is provided with the second via hole 402. The first connection part 40 is exposed through the second via hole 402. The second connection part 50 is electrically connected to the first connection part 40 through the second via hole 402.

The third planarization layer 217 is disposed on the second connection part 50. The pixel electrode 31 is disposed on the second planarization layer 216. The third planarization layer 217 is provided with third via hole 403. The second connection part 50 is exposed through the third via hole 403. The pixel electrode 31 is electrically connected to the second connection part 50 through the third via hole 403.

In some embodiments, the orthographic projections of the first via hole 401 and the second via hole 402 on the base substrate 10 may be spaced apart. Alternatively, the orthographic projections of the first via hole 401 and the second via hole 402 on the base substrate 10 may be adjacent to each other. The length of the distance between the first via hole 401 and the second via hole 402 on the base substrate 10 also affects the length of the second connection part 50. Specifically, the longer the distance between the first via hole 401 and the second via hole 402 on the base substrate 10 is, the longer the line length of the second connection part 50 is. The shorter the distance between the first via hole 401 and the second via hole 402 on the base substrate 10 is, the shorter the line length of the second connection part 50 is.

As shown in FIG. 2 and FIG. 6, the orthographic projections of the first via hole 401 and the second via hole 402 on the base substrate 10 are arranged at intervals. Since the first connection part 40 is located in the first display area 101, specifically, the first connection part 40 is located in the fan-out area 103, and the orthographic projection area of the first connection part 40 on the base substrate 10 along the first direction Y increases sequentially. By arranging the first via hole 401 and the second via hole 402 at intervals, the lines of the second connection part 50 can be made to have a certain length. Therefore, the normal connection between the second connection part 50 and the signal lines such as the voltage signal line VDD can be ensured, thereby ensuring the normal display function of the fan-out area 103.

As shown in FIG. 8 and FIG. 6, the orthographic projections of the first via hole 401 and the second via hole 402 on the base substrate 10 are disposed adjacent to each other. Since the first connection part 40 is located in the first display area 101 and the second display area 102, the area of each first connection part 40 in the first display area 101 is the same as the area of each first connection part 40 in the second display area 102. The first via hole 401 and the second via hole 402 are arranged adjacent to each other, so that one end of the first connection part 40 can be electrically connected to the first connection part 40 and other film layers such as the source and drain layer 213. The other end of the first connection part 40 is connected to the voltage signal line VDD and other lines, so as to ensure the connection function of the first connection part 40. This makes the structure of the first via hole 401 and the second via hole 402 compact in the area of the sub-pixel 20, which is beneficial to further improve the utilization rate of the area of the sub-pixel 20. This is beneficial to increase the accommodating space of the first connection part 40. The first connection part 40 can form a larger projected area on the base substrate 10, which facilitates the fabrication and formation of the first connection part 40 in the process.

In some embodiments, as shown in FIG. 6, the driving transistor 21 further includes a bridge layer 214. The bridge layer 214 is disposed between the source and drain layer 213 and the first connection part 40. One end of the bridge layer 214 is connected to the first connection part 40, and the other end thereof is connected to the source or drain of the source and drain layer 213. The material of the bridge layer 214 can be the same as that of the source and drain layer 213. The bridge layer 214 can be used to connect the voltage signal line VDD, so as to increase the number of connections between the driving transistor 21 and the signal line VDD, thereby enhancing the display driving capability.

It should be noted that, in the display panel, film layers such as a light-emitting functional layer, an encapsulation layer, a touch layer, a polarizing layer, and a cover plate may also be provided on the pixel electrode 31.

The present application also provides a display device. The display device includes a display panel. The display device according to the embodiment of the present application is used to connect the driving transistor 21 and the pixel electrode 31 through the first connection part 40 of the display panel and is also used to connect the signal line. By setting the orthographic projection areas of the first connection parts 40 along the first direction Y on the base substrate 10 to increase sequentially, it is possible to avoid excessive differences in the areas of different first connection parts 40. Therefore, in the first direction Y of the display panel, the light-emitting brightness of the sub-pixels 20 corresponding to the first connection part 40 is in a gradient form. In this way, the boundary of display brightness is weakened in the first direction Y, thereby improving the brightness uniformity of the display panel. Alternatively, by setting the orthographic projection area of each first connection part 40 on the base substrate 10 to be the same, the regularity of the distribution of the first connection part 40 is improved. This makes the light-emitting brightness of the sub-pixels 20 corresponding to the first connection part 40 uniform, thereby improving the brightness uniformity of the display panel. By improving the regularity of the arrangement of the first connection parts 40 on the display panel in the embodiments of the present application, when the pixel circuit drives the sub-pixels 20 to emit light, the display uniformity of the sub-pixels 20 can be improved, thereby improving the overall display performance of the display panel. Since the display device has the above-mentioned display panel, it has all the same beneficial effects, which will not be repeated in this embodiment.

The embodiments of the present application do not specifically limit the application of the display device. It can be any product or part with display function such as TV, laptop, tablet, wearable display device (such as smart bracelet, smart watch, etc.), mobile phone, virtual reality device, augmented reality device, car display, advertising light box, etc.

In the above embodiments, the description of each embodiment has its own emphasis. For parts that are not described in detail in a certain embodiment, reference may be made to related descriptions of other embodiments.

During specific implementation, each of the above units or structures may be implemented as independent entities. It can also be combined arbitrarily and implemented as the same or several entities. For the specific implementation of the above units or structures, reference may be made to the foregoing method embodiments, and details are not described herein again.

The display panel and the display device provided by the embodiments of the present application are described in detail above. Specific examples are used herein to illustrate the principles and implementations of the embodiments of the present application. The descriptions of the above embodiments are only used to help understand the technical solutions and core ideas of the embodiments of the present application. Those of ordinary skill in the art should understand that the technical solutions described in the foregoing embodiments can still be modified, or equivalently replace some of the technical features. However, these modifications or substitutions do not make the essence of the corresponding technical solutions deviate from the scope of the technical solutions of the embodiments of the present application.

What is claimed is:

1. A display panel, comprising:
   a base substrate;
   a plurality of sub-pixels arranged in an array on the base substrate, wherein each of the sub-pixels comprises a pixel circuit and a light-emitting element, the pixel circuit is configured to drive the light-emitting element, the pixel circuit comprises a driving transistor, and the light-emitting element comprises a pixel electrode; and
   a plurality of first connection parts, wherein at least one part of the first connection parts are arranged at intervals along a first direction and have respective areas of orthographic projections on the base substrate sequentially increasing along the first direction, the pixel electrode is connected to the driving transistor through one of the first connection parts, and the first connection parts are further configured to connect signal lines, wherein the at least one part of the first connection parts have a same width, and respective lengths sequentially increasing along the first direction.

2. The display panel of claim 1, wherein at least another part of the first connection parts are arranged along a second direction and have a same area of an orthographic projection on the base substrate, and the first direction intersects the second direction.

3. The display panel of claim 1, wherein the display panel has a first display area and a fan-out area overlapping the first display area, and the first connection parts are located in the first display area.

4. The display panel of claim 1, wherein the driving transistor comprises:
   an active layer disposed on the base substrate;
   a gate layer disposed on the active layer; and
   a source and drain layer disposed on the gate layer;
   wherein the display panel further comprises a first via hole and a second via hole, and the one of the first connection parts is connected to the source and drain layer through the first via hole and is connected to the pixel electrode through the second via hole.

5. The display panel of claim 4, further comprising:
   a plurality of second connection parts, wherein one of the second connection parts is connected between the pixel electrode and the one of the first connection parts.

6. The display panel of claim 5, wherein the first connection parts and the second connection parts are made of a transparent conductive material.

7. The display panel of claim 5, wherein respective orthographic projections of the first via hole and the second via hole on the base substrate are adjacent to each other, or are spaced apart from each other.

8. The display panel of claim 5, wherein the driving transistor further comprises:
   a first planarization layer disposed on the source and drain layer, wherein the one of the first connection parts is disposed on the first planarization layer, the first planarization layer is provided with the first via hole, the source and drain layer is exposed through the first via hole, and the one of the first connection parts is electrically connected to the source and drain layer through the first via hole; and
   a second planarization layer disposed on the one of the first connection parts, wherein the one of the second connection parts is disposed on the second planarization layer, the second planarization layer is provided with the second via hole, the one of the first connection parts is exposed through the second via hole, and the one of the second connection parts is electrically connected to the one of the first connection parts through the second via hole.

9. The display panel of claim 8, wherein the driving transistor further comprises:
   a third planarization layer disposed on the one of the second connection parts, wherein the pixel electrode is disposed on the third planarization layer, the third planarization layer is provided with a third via hole, the one of the second connection parts is exposed through the third via hole, and the pixel electrode is electrically connected to the one of the second connection parts through the third via hole.

10. The display panel of claim 4, wherein the driving transistor further comprises:
    a bridge layer disposed between the source and drain layer and the one of the first connection parts, one end of the bridge layer is connected to the one of the first connection parts, and another end of the bridge layer is connected to a source or a drain of the source and drain layer.

11. The display panel of claim 10, wherein a material of the bridge layer is same as a material of the source and drain layer.

12. A display device comprising:
    a display panel, the display panel comprising:
      a base substrate;
      a plurality of sub-pixels arranged in an array on the base substrate, wherein each of the sub-pixels comprises a pixel circuit and a light-emitting element, the pixel circuit is configured to drive the light-emitting element, the pixel circuit comprises a driving transistor, and the light-emitting element comprises a pixel electrode; and
      a plurality of first connection parts, wherein at least one part of the first connection parts are arranged at intervals along a first direction and have respective areas of orthographic projections on the base substrate sequentially increasing along the first direction, the pixel electrode is connected to the driving transistor through one of the first connection parts, and the first connection parts are further configured to connect signal lines,
      wherein the at least one part of the first connection parts have a same width, and respective lengths sequentially increasing along the first direction.

13. The display device of claim 12, wherein at least another part of the first connection parts are arranged along a second direction and have a same area of an orthographic projection on the base substrate, and the first direction intersects the second direction.

14. The display device of claim 12, wherein the display panel has a first display area and a fan-out area overlapping the first display area, and the first connection parts are located in the first display area.

15. The display device of claim 12, wherein the display panel further comprises:
    a plurality of second connection parts, wherein one of the second connection parts is connected between the pixel electrode and the one of the first connection parts, and the first connection parts and the second connection parts are made of a transparent conductive material.

16. The display device of claim 12, wherein the display panel further comprises a first via hole and a second via hole, and the one of the first connection parts is connected to the driving transistor through the first via hole and is connected to the pixel electrode through the second via hole.

* * * * *